United States Patent [19]
Morishita et al.
[11] 3,801,427
[45] Apr. 2, 1974

[54] PRINTED CIRCUIT PLATE

[75] Inventors: Hirosada Morishita; Ryusei Sasaki; Kiyoshi Sakashita; Eiji Yasui, all of Hitachi, Japan
[73] Assignee: Hitachi, Ltd., Tokyo, Japan

[22] Filed: Dec. 10, 1971
[21] Appl. No.: 206,727

[30] Foreign Application Priority Data
Dec. 25, 1970 Japan .............................. 45-117626

[52] U.S. Cl. .......................... 161/162, 156/3, 156/7, 161/156, 161/158, 161/168, 161/170, 161/214, 161/215
[51] Int. Cl. ................................................ B32b 5/16
[58] Field of Search ............. 161/93, 156, 158, 186, 161/214, 215, 216, 231, 233, 252, 258, 247, 257, 162, 168–170; 174/68.5; 156/3, 7, 8

[56] References Cited
UNITED STATES PATENTS
3,242,027 3/1966 Dowda ............................ 161/214 X
3,684,616 8/1972 Wright et al. ...................... 161/93 X
2,778,762 1/1957 Eisler ............................. 161/162 X
3,258,387 6/1966 Brown et al. .................... 161/158 X
3,527,665 9/1970 Wright et al. ...................... 161/93 X
3,556,928 1/1971 Zolg .................................... 161/186
3,676,285 7/1972 Agens et al. ..................... 161/186 X

*Primary Examiner*—William A. Powell
*Attorney, Agent, or Firm*—Craig and Antonelli

[57] ABSTRACT

A printed circuit plate excellent in dimensional stability, heat resistance in soldering and adhesion to printed circuit film and having electric properties not inferior to those of the conventional printed circuit plate can be obtained by compression molding a prepreg comprising glass fibers and a thermosetting resin which is filled with 20–70 percent by weight of inorganic powders mainly composed of $SiO_2$, $CaCO_3$, $Al_2O_3$, CaO, $CaF_2$, etc. and having a diameter of less than 200 $\mu$.

10 Claims, 2 Drawing Figures

PATENTED APR 2 1974

3,801,427

INVENTOR

HIROSADA MORISHITA, RYUSEI SASAKI,

KIYOSHI SAKASHITA, EIJI YASUI

BY

Craig, Antonelli & Hill
ATTORNEYS

PRINTED CIRCUIT PLATE

BACKGROUND OF THE INVENTION

Conventionally, as an insulating substrate for print wiring (referred to as merely an insulating substrate hereinafter), a plate obtained by heat molding a glass cloth which is impregnated with a thermosetting resin, e.g., phenolic resins, polyester resins and epoxy resins has been mainly used. Recently, devices such as communication devices, electronic computer have been more and more small-sized and hence high exactness and minuteness of wiring circuits have been strongly demanded in printed circuit plate, too. For this purpose, multi-layer printed circuit plates have been proposed and the insulating substrate therefor has been required to have heat resistance in soldering, heat deformation resistance and dimensional stability in heat molding for obtaining multi-layers (to avoid disagreement of patterns in adjacent layers). Some of the conventional substrates of epoxy resin are excellent in these points, but are not sufficient. Therefore, many attempts have been made to obtain insulating substrates having high heat resistance and dimensional stability and not inferior to the conventional substrates in mechanical workability and electric properties by variously modifying resins. However, only the modification cannot easily improve the conventional substrates and moreover, is not so advantageous in production cost.

Printed circuit may be formed on an insulating substrate by applying adhesive comprising a thermosetting resin to the insulating substrate then allowing a metallic foil such as electrolytic copper foil to adhere on said adhesive layer by heat molding to obtain the so-called MCL (copper foil-applied laminate) and then etching thus obtained laminate. Furthermore, printed circuit may also be formed by applying a phenol adhesive modified with nitrile rubber to an insulating substrate which is allowed to half-set, then forming a desired circuit thereon by plating and thereafter setting said adhesive. According to these methods, the printed circuit plate is apt to deform or change in its size due to the heating at adhering of copper foil and setting of adhesive. The conventional insulating substrates have no sufficient reliability in the above mentioned points as multi-layer printed circuit plate which requires especially high exactness and minuteness.

SUMMARY OF THE INVENTION

The first object of the present invention is to provide a novel printed circuit plate.

The second object of the present invention is to provide a printed circuit plate having excellent dimensional stability.

The third object of the present invention is to provide a printed circuit plate which undergoes no heat deformation.

The fourth object of the present invention is to provide a printed circuit plate excellent in heat resistance in soldering.

The fifth object of the present invention is to provide a printed circuit plate having excellent adhesion between circuit film and substrate.

The sixth object of the present invention is to provide a multi-layer printed circuit plate which satisfies the above second to fifth requirements.

Other objects of the present invention will be readily apparent from the following detailed description of certain preferred embodiments thereof.

The characteristic of the present invention resides in a printed circuit plate obtained by compression molding a prepreg which comprises glass fibers and a thermosetting resin which is filled with 20–70 percent by weight of inorganic powders mainly composed of $SiO_2$, $CaCO_3$, $Al_2O_3$, CaO, $CaF_2$, etc. and having a diameter of less than 200 $\mu$.

DETAILED DESCRIPTION

Figure 1:
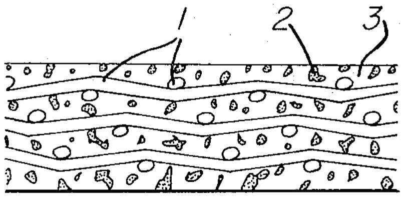
FIG. 1 is a cross section of the printed circuit plate of the present invention.

The present invention resides in a printed circuit plate obtained by compression molding a pregreg comprising glass fibers and a thermosetting resin which is filled with 20–70 percent by weight of inorganic powders mainly composed of $SiO_2$, $CaCO_3$, $Al_2O_3$, CaO, $CaF_2$, etc. and having a diameter of less than 200 $\mu$.

In case of forming multi-layer printed circuit by piling two or more of said printed circuit plates on which circuits are formed, a prepreg produced by impregnating glass fibers with a thermosetting resin is put between substrates and thus obtained laminate is heat molded. The prepreg used in this case naturally includes the prepreg which is filled with above mentioned inorganic powders.

The inorganic powders mainly composed of $SiO_2$, $CaCO_3$, CaO, $Al_2O_3$, $CaF_2$, etc. used in the present invention include talc, clay, siliceous stone, diatomaceous earth, pyrosclerite, fluorite, dolomite, sericite, kaolin, alumina, silica, glass, etc. The reason for selecting such inorganic powders is that these are excellent as electric insulator and hence give no effect on the electric properties of insulating substrate which is filled with them. Furthermore, since these have low coefficient of linear expansion, the coefficient of linear expansion of the insulating substrate which is filled with them is decreased and the difference between the coefficient of linear expansion of the substrate and that of a metallic foil circuit formed on the substrate can be made small. Thus, distortion of the plate at laminate molding or soldering can be made small. Furthermore, the low coefficient of linear expansion is also advantageous in the dimensional stability.

The diameter of said inorganic powders is preferably less than 200 $\mu$ from viewpoint of workability and mechanical properties of the insulating substrate. In case of increasing adhesion between the substrate and the circuit film by etching the surface of the substrate (this embodiment will be explained hereinafter), the diameter is also preferably less than 200 $\mu$. These inorganic powders may be used singly or in admixture of two or more. Furthermore, these inorganic powders have preferably an apparent specific gravity of less than 0.5 because such apparent specific gravity is preferable for prevention of setting separation of the powders in filling the resin with them. The amount of the inorganic powders with which the resin is filled is preferably 20–70 percent of the resin. When the amount is less than 20 percent, the purpose cannot be fully attained and when more than 70 percent, the mechanical strength of the molded insulating substrate is extremely decreased.

As the thermosetting resins which are to be filled with said inorganic powders, epoxy, polyester, polyamide, polyimide amide, phenolic, urea, melamine resins, etc. may be used. Said thermosetting resins which are filled with said inorganic powders and glass cloth, etc. are laminate molded to obtain the insulating substrate of the present invention. Furthermore, in case of laminate molding a multi-layer printed circuit plate, the insulating substrates between which a prepreg obtained from the resin which are filled with said inorganic powders is put may be molded.

Thus obtained insulating substrate may be used as an insulating substrate excellent in heat resistance and dimensional stability in the same manner as the conventional insulating substrate as explained hereinafter. Moreover, the surface of the insulating substrate may be made porous by contacting the surface with an etching solution which is capable of corroding and dissolving the filling powders in the surface layer of the insulating substrate to remove the powders. In this case, since the surface of the insulating substrate is covered with resin, the surface of the resin is firstly allowed to contact with an etching solution capable of corroding and dissolving said resin to remove the resin and to expose a part of the filling powders and thereafter the surface is allowed to contact with an etching solution capable of corroding and dissolving the powders, whereby only the inorganic powders can be easily removed. The irregularities of the surface of thus obtained insulating substrate are substantially different from those formed by etching or sandblasting the conventional insulating substrate obtained without the inorganic powders. That is, the irregularities according to the present invention comprise pores formed due to falling off of the filling inorganic powders and hence the pores have mainly the pot-like shape. When a metallic film such as electrolytic copper foil is allowed to adhere to thus obtained insulating substrate for forming a printed circuit, the adhesive enters said pot-shaped pores to exhibit anchoring effect and thus the adhesion is further increased. The same anchoring effect can also be obtained by applying direct chemical plating onto the substrate without adhesive. Thus, without using any adhesive, an insulating circuit plate having strong adhesion to the circuit film can be obtained.

As said etching solution, chromic acid mixture is preferable for corroding and dissolving the resin layer on the surface of the insulating substrate to expose the inorganic powders. Firstly, the surface resin layer is corroded and dissolved with said chromic acid mixture and then the exposed inorganic powders are corroded and dissolved with a mixed acid of 49 percent hydrofluoric acid and concentrated sulfuric acid in a weight ratio of 2:1 to remove the powders. The etching time is less than 1 minute at room temperature in the former case and 2–5 minutes at 50°–70° C in the latter case. In both cases, excess etching is not preferred because the adhesion is rather decreased.

Formation of copper film on said insulating substrate may be attained by any methods, e.g., by allowing a copper foil to adhere to the substrate at or after molding or by applying copper plating.

The present invention will be illustrated by the following Examples.

Example I

A mixture of 100 parts of bisphenol A type epoxy resin, 4 parts of dicyandiamide and 0.2 part of benzyldimethyl amine was filled with each of silica, talc and alumina in a blending ratio as shown in Table 1. Each of the blend was mixed in a mortar for about 1 hour. Glass cloth was impregnated with each of the mixture. Each of thus impregnated glass cloth was preset at 120° C for 30 minutes. Thereafter, each of the glass cloths was molded under a pressure of 50 kg/cm² at 170° C for 60 minutes to obtain laminated insulating substrates containing about 50 percent by weight of the glass cloth of the resin which was filled with said powders. Volume resistivity, surface resistance and dielectric loss tangent of thus obtained insulating substrates were measured in accordance with JIS C 6481. Moreover, coefficient of linear expansion was measured to obtain dimensional stability. These results are shown in Table 1.

TABLE 1

| Filler | None | Silica (1–80 μ)* | | Talc (1–50 μ)* | | Alumina (less than 150 μ)* | |
|---|---|---|---|---|---|---|---|
| Amount (percent) | 0 | 40 | 60 | 40 | 60 | 40 | 60 |
| Volumeric resistivity (Ωcm) | $^{14}9.7 \times 10$ | $^{15}7.7 \times 10$ | $^{15}7.5 \times 10$ | $^{15}7.0 \times 10$ | $^{15}7.1 \times 10$ | $^{15}4.8 \times 10$ | $^{15}4.3 \times 10$ |
| Surface resistance (Ω) | $^{15}1.4 \times 10$ | $^{15}1.5 \times 10$ | $^{15}3.7 \times 10$ | $^{15}2.5 \times 10$ | $^{15}3.1 \times 10$ | $^{14}5.9 \times 10$ | $^{14}5.7 \times 10$ |
| Dielectric loss tangent (percent) | 2.7 | 2.5 | 2.7 | 2.4 | 2.8 | 2.8 | 2.9 |
| Coefficient of linear expansion (×10−5 °C⁻¹) | 7.0 | 3.2 | 2.3 | 3.1 | 2.0 | 2.2 | 1.3 |

*Diameter of powders.

As is clear from Table 1, the electric properties of the insulating substrates which were filled with inorganic powders are substantially identical with those of the substrates which were filled with no inorganic powders. The coefficient of linear expansion of the insulating substrates which were filled with the inorganic powders was low and was close to $1.7 \times 10^{-5}$ ° $C^{-1}$ which is coefficient of linear expansion of copper or $1.4 \times 10^{-5}$ ° $C^{-1}$ which is coefficient of linear expansion of gold. Therefore, thermal stress between the substrate and printed circuit film becomes low and thus the insulating substrates causing little separation and warp of circuit plates and having high dimensional stability can be obtained.

Then, copper film was formed on the surface of the insulating substrates shown in Table 1. Heat resistance in soldering and adhesion strength of the copper film were compared with those of commercially available copper foil-applied laminated plate.

Nitric rubber-phenolic adhesive was applied to the surface of the insulating substrates shown in Table 1. These substrates were then allowed to stand at room temperature to be half-set. Then, the surface of the substrates were activated by dipping in 0.02 percent palladium chloride solution. Then, the substrates were subjected to chemical copper plating at 20°–23° C with a solution which was obtained by adding 10 g of copper sulfate, 25 ml of formalin and 50 g of Rochelle salt to 1 l of distilled water and whose pH was adjusted to 12.5 with caustic soda. Then, the substrates were subjected to electric copper plating in an aqueous solution obtained by adding 85 g of copper pyrophosphate, 32 g of potassium pyrophosphate and a small amount of ammonia water to 1 l of distilled water to allow the copper film to grow to 35 μ. Thus, samples (I) were obtained.

Furthermore, the insulating substrates filled with inorganic powders as shown in Table 1 were dipped in chromic acid mixture at room temperature for 30 minutes to etch the surface resin layer to expose a part of filling powders. Thereafter, the substrates were etched with a mixed acid of 49 percent hydrofluoric acid and concentrated sulfurric acid in a weight ratio of 2:1 at 60° C for 3 minutes. After completion of etching, the substrates were washed with water in running water at 20°–25° C for 10 minutes. Thereafter, said nitrile rubber-phenolic adhesive was applied to the substrates, which were then subjected to chemical copper plating and electric copper plating in the same manner as mentioned above to form copper film. Thus, samples (II) were obtained.

Moreover, after the surface of the insulating substrates were etched with chromic acid mixture and hydrofluoric acid-sulfuric acid in the same manner as mentioned above, the substrates were subjected to chemical copper plating and electric copper plating without using adhesive to form copper film. Thus, samples (III) were obtained.

Each of thus obtained samples was subjected to heat resistance test in soldering and adhesion strength test of copper film in accordance with JIS C 6481 and the results are shown in Table 2 in comparison with those of commercially available copper foil-applied laminate (MCL method).

The heat resistance in soldering was obtained by introducing a sample of 50 mm × 50 mm onto a solder bath at 260° C with the copper film side under and measuring the time at which the copper film was separated from the substrate or the copper film is swelled. The adhesion strength was expressed by tearing off strength (kg/cm) measured using a sample of 10 mm (width) × 100 mm (length) at a constant speed.

TABLE 2

| Samples | | Percent | Heat resistance in soldering at 260 °C (second) | Tearing off strength (kg/cm) |
|---|---|---|---|---|
| | | 0 | 80 | 1.4 |
| I | Talc | 40 | 100 | 1.4 |
| | | 60 | 115 | 1.4 |
| | Alumina | 40 | 90 | 1.4 |
| | | 60 | 105 | 1.4 |
| II | Talc | 40 | 120 | 2.0 |
| | | 60 | 110 | 1.6 |
| | Alumina | 40 | 110 | 2.1 |
| | | 60 | 110 | 1.5 |
| III | Talc | 40 | 150 | 2.5 |
| | | 60 | 150 | 1.8 |
| | Alumina | 40 | 130 | 2.4 |
| | | 60 | 115 | 1.5 |
| Commercially available copper foil-applied laminate plate | | | 60 | 1.5 |

As is clear from Table 2, an increased heat resistance in soldering can be attained by using an insulating substrate which was filled with inorganic powders.

Moreover, the adhesion strength between the surface of the substrate which was etched and the circuit copper film was high.

The following Example shows the relation between the properties of the substrate and diameter of the inorganic powders.

Example II 40 percent by weight of three kinds of alumina having a diameter of less than 150 μ, 150–200 μ and 200–250 μ were respectively added to epoxy resin to obtain three glass cloths in the same manner as in Example I. Copper film was formed on thus obtained substrates by chemical plating-electrical plating. The heat resistance in soldering, tearing off strength and bending strength of the substrates were measured. The bending strength was measured at a bending speed of 2 mm/min and at a distance between the fulcrum of 50 mm. The results are shown in Table 3.

As is clear from Table 3, when diameter of inorganic powders was more than 200 μ, heat resistance in soldering and tearing off strength were extremely decreased.

TABLE 3

| Diameter of filler (μ) | Less than 150 | 150–200 | 200–250 |
|---|---|---|---|
| Heat resistance in soldering (second) | 150 | 130 | 80 |
| Tearing off strength (kg/cm) | 2.2 | 2.0 | 1.4 |
| Bending strength (kg/mm²) | 110.1 | 102.3 | 99.6 |

Furthermore, insulating substrates which were filled with inorganic powders were produced from resol type phenolic resin in the same manner as in the case of using epoxy resin. The heat resistance in soldering was measured to find that thus obtained substrates were superior to those which were filled with no powders as in the case of using epoxy resin.

The present invention will be illustrated with reference to the drawings. FIG. 1 is a rough sketch of cross section of the insulating substrate according to the present invention, which was obtained by impregnating a glass cloth comprising glass fibers 1 with thermosetting resin composition 3 which was filled with inorganic powders 2, half-setting the glass cloth to obtain a prepreg and heat molding the prepreg.

Figure 2:
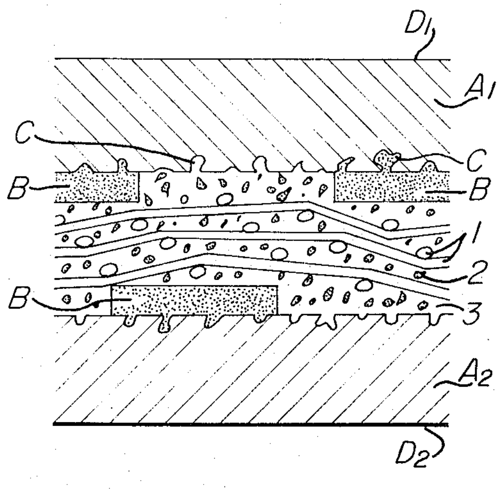
FIG. 2 is a cross section of the multi-layer printed circuit plate of the present invention.

FIG. 2 is a rough sketch of cross section of multilayer printed circuit plate produced from the insulating substrate shown in FIG. 1. This was obtained by corroding the surface of the insulating substrate shown in FIG. 1 with chromic acid mixture to remove the resin which covers inorganic powders in surface layer to expose a part of the inorganic powders in the surface layer, then removing the inorganic powders by corroding and dissolving them with mixed acid of hydrofluoric acid and concentrated sulfuric acid to form innumerable pot-shaped pores on the surface of the substrate and thereafter forming the desired printed circuit copper film B by chemical plating and electrical plating. Then, prepreg produced by impregnating a glass cloth comprising glass fibers 1 with a thermosetting resin composition 3 which was filled with inorganic powders 2 was put between said printed circuit plates $A_1$ and $A_2$ and the resultant laminate was heat molded to obtain a multi-layer printed circuit plate.

In this case, the thermosetting resin which forms circuit copper film or prepreg enters said pot-shaped pores shown as C to exhibit anchoring effect whereby the adhesion between substrate $A_1$–copper film B and between substrates $A_1$–$A_2$ is increased. Furthermore, desired circuit is further formed on the surfaces $D_1$ and $D_2$ of thus obtained multi-layer printed circuit plate. Connection of these printed circuit is attained by applying the through-hole plating to holes provided. It was also confirmed that the formation of these holes can be effected more easily in the substrate filled with inorganic powders as compared with the substrate filled with no powders.

What is claimed is:

1. An improved printed circuit plate including a structure having a molded prepreg layer of glass fibers impregnated with thermosetting resin and inorganic powders wherein the improvement comprises pot-shaped pores formed in the surface layers of the structure by removal of inorganic powders from the surface layers of said structure and at least one metal film layer and additional prepreg layer adhere to the surface layers by anchoring to the pot-shaped pores.

2. A printed circuit plate according to claim 1, wherein the inorganic powders are included by 20–70 percent by weight in the molded prepreg.

3. A printed circuit plate according to claim 1, wherein the inorganic powders are inorganic acid-soluble.

4. A printed circuit plate according to claim 1, wherein the inorganic powders are at least one of $SiO_2$, $CaCO_3$, $Al_2O_3$, CaO and $CaF_2$.

5. A printed circuit plate according to claim 1, wherein the inorganic powders are particles having a diameter of less than 200$\mu$.

6. A printed circuit plate according to claim 1, wherein conductive metal film layers adhere to the surface layers in a predetermined circuit pattern.

7. A printed circuit plate according to claim 1, wherein additional prepreg layers adhere to the surface layers.

8. A printed circuit plate according to claim 1, wherein conductive metal film layers in a predeterminqd circuit pattern and additional prepreg layers both adhere to the surface layers.

9. A multi-layer printed circuit plate having at least two of the printed circuit plates of claim 1, wherein a laminated structure is formed having additional prepreg layers between said at least two printed circuit plates and adhering to the surface layers of said at least two printed circuit plates by anchoring to the pot-shaped pores.

10. A multi-layer printed circuit plate according to claim 9, wherein conductive metal film layers in the predetermined circuit patterns adhere to the surface layers of said at least two printed circuit plates by anchoring to the pot-shaped pores.

* * * * *